United States Patent
Schaedler et al.

(10) Patent No.: US 9,731,471 B2
(45) Date of Patent: Aug. 15, 2017

(54) CURVED HIGH TEMPERATURE ALLOY SANDWICH PANEL WITH A TRUSS CORE AND FABRICATION METHOD

(71) Applicant: HRL Laboratories, LLC, Malibu, CA (US)

(72) Inventors: Tobias A. Schaedler, Oak Park, CA (US); Jacob M. Hundley, Los Angeles, CA (US); John H. Martin, Ventura, CA (US); Christopher S. Roper, Santa Monica, CA (US); Eric C. Clough, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/970,521

(22) Filed: Dec. 15, 2015

(65) Prior Publication Data
US 2017/0080673 A1    Mar. 23, 2017

Related U.S. Application Data

(60) Provisional application No. 62/261,492, filed on Dec. 1, 2015, provisional application No. 62/092,750, filed on Dec. 16, 2014.

(51) Int. Cl.
| | |
|---|---|
| B32B 3/20 | (2006.01) |
| B32B 3/12 | (2006.01) |
| B33Y 10/00 | (2015.01) |
| B29C 45/00 | (2006.01) |
| B29C 67/00 | (2017.01) |

(Continued)

(52) U.S. Cl.
CPC ............ *B32B 3/12* (2013.01); *B29C 45/0053* (2013.01); *B29C 67/0051* (2013.01); *B29C 67/0066* (2013.01); *B32B 15/20* (2013.01); *B33Y 10/00* (2014.12); *B33Y 80/00* (2014.12); *C23F 1/00* (2013.01); *C25D 3/12* (2013.01); *C25D 3/562* (2013.01); *B29C 2045/0079* (2013.01); *B29L 2007/002* (2013.01); *B32B 2307/304* (2013.01);

(Continued)

(58) Field of Classification Search
None
See application file for complete search history.

(56) References Cited

U.S. PATENT DOCUMENTS

| | | |
|---|---|---|
| 8,320,727 B1 | 11/2012 | Jacobsen et al. |
| 8,453,717 B1 | 6/2013 | Roper et al. |

(Continued)

OTHER PUBLICATIONS

International Search Report and the Written Opinion issued in PCT/US2015/065918, dated May 4, 2016, 11 pages.

(Continued)

*Primary Examiner* — Adam Krupicka
(74) *Attorney, Agent, or Firm* — Lewis Roca Rothgerber Christie, LLP

(57) ABSTRACT

A lightweight sandwich panel structure with a complex shape and curvature, and a method to fabricate such a panel out of high temperature alloys. Embodiments of a micro-truss core structure that offer high specific strength and stiffness while allowing for curvature, and methods for depositing multiple layers of metals that can be interdiffused into complex alloys, are provided. A core of a panel may be fabricated from a polymer template, which may be shaped, e.g., curved, and coated with metal layers, which may then be heat treated to cause the layers of metal to interdiffuse, to form an alloy.

22 Claims, 20 Drawing Sheets
(4 of 20 Drawing Sheet(s) Filed in Color)

(51) Int. Cl.
  *C23F 1/00*   (2006.01)
  *B33Y 80/00*  (2015.01)
  *B32B 15/20*  (2006.01)
  *C25D 3/12*   (2006.01)
  *C25D 3/56*   (2006.01)
  *B29L 7/00*   (2006.01)

(52) U.S. Cl.
  CPC ..... *B32B 2307/306* (2013.01); *B32B 2607/00* (2013.01)

(56) References Cited

U.S. PATENT DOCUMENTS

| | | | |
|---|---|---|---|
| 9,096,722 | B2 | 8/2015 | Yang et al. |
| 9,116,428 | B1 | 8/2015 | Jacobsen et al. |
| 2010/0300669 | A1 | 12/2010 | Jacobsen et al. |
| 2013/0143060 | A1 | 6/2013 | Jacobsen et al. |
| 2013/0273347 | A1 | 10/2013 | Jacobsen et al. |
| 2014/0252674 | A1 | 9/2014 | Hundley et al. |
| 2016/0160952 | A1 | 6/2016 | Schaedler et al. |

OTHER PUBLICATIONS

U.S. Appl. No. 14/197,073, Hundley et al.
U.S. Appl. No. 14/226,801, Hundley et al.
D. Mukherji and J. Rosler, "Design considerations and strengthening mechanisms in developing Co-Re-based alloys for applications at + 100° C. above Ni-superalloys", Advanced Materials Research, vol. 278, (2011), pp. 539-544.
S.M. Pingle, N. A. Fleck, V. S. Deshpande and H.N.G. Wadley, "Collapse mechanism maps for a hollow pyramidal lattice", Proc. R. Soc. A (2010), pp. 985-1011.
S.M. Pingle, N. A. Fleck, V. S. Deshpande and H.N.G. Wadley, "Collapse mechanism maps for the hollow pyramidal core of a sandwich panel under transverse shear", International Journal of Solids and Structures, vol. 48, (2011), pp. 3417-3430.
L.E. Netherton and M.L. Holt, "Electrodeposition of Rhenium-Cobalt and Rhenium-Iron Alloys", Journal of the Electrochemical Society, 1952, vol. 99, No. 2, pp. 44-47.
Alan J. Jacobsen, William Barvosa-Carter, and Steven Nutt, "Microscale Truss Structures formed from Self-Propagating Photopolymer Waveguides", Advanced Materials, 2007, vol. 19, pp. 3892-3896.

| Coatings | Thickness | Process |
|---|---|---|
| Si, C, B, Zr, Hf and/or Y | <2% | CVD or PVD |
| Mo, W, Ta, Ti and/or Re | 1-15% | |
| Aluminum | 10-40% | pack cementation or CVD |
| Chromium | 10-40% | |
| Nickel and/or Cobalt | 100% | electroplating |

*FIG. 7A*

| Coatings | Thickness | Process |
|---|---|---|
| Cr, Al, Ta, and/or Si, etc. | 5-40% | CVD or PVD |
| Cobalt and Rhenium | 100% | electroplating |
| Cobalt or Nickel | 20-100% | electroplating |
| Cobalt or Nickel | | PVD |
| Titanium | <10% | PVD |

*FIG. 7B*

| Coatings | Thickness | Process |
|---|---|---|
| Al, Ni, Ta and/or Si | 1-20% | CVD or PVD |
| Chromium | 10-40% | |
| Cobalt and Rhenium | 100% | electroplating |

FIG. 7C

| Coatings | Thickness | Process |
|---|---|---|
| Multicomponent Alloy | 10-500% | cathodic arc deposition |
| Ni, Co or Cu | 100% | electroplating |

FIG. 7D

CURVED HIGH TEMPERATURE ALLOY SANDWICH PANEL WITH A TRUSS CORE AND FABRICATION METHOD

CROSS-REFERENCE TO RELATED APPLICATION(S)

The present application claims priority to and the benefit of U.S. Provisional Application No. 62/092,750, filed Dec. 16, 2014, entitled "CURVED HIGH TEMPERATURE ALLOY SANDWICH PANEL WITH A TRUSS CORE AND FABRICATION METHOD", the entire content of which is incorporated herein by reference, and the present application also claims priority to and the benefit of U.S. Provisional Application No. 62/261,492, filed Dec. 1, 2015 titled "MECHANICAL PERFORMANCE OF HOLLOW TETRAHEDRAL TRUSS CORES", the entire content of which is also incorporated herein by reference.

This application is also related to and incorporates by reference in its entirety, as if set forth in full, U.S. Pat. No. 7,382,959 ("the '959 patent").

STATEMENT REGARDING FEDERALLY SPONSORED RESEARCH OR DEVELOPMENT

This invention was made with U.S. Government support under contract No. W91CRB-10-C-0305 awarded by DARPA DSO. The U.S. Government has certain rights in this invention.

BACKGROUND

1. Field

One or more aspects of embodiments according to the present invention relate to composite structures, and more particularly to a lightweight, heat resistant sandwich structure.

2. Description of Related Art

Lightweight sandwich structures and core materials capable of withstanding high temperatures have multiple applications, including, Acreage Thermal Protection Systems for high-speed aircraft, aircraft propulsion applications, energy-absorbing impact protection panels, heat shields. Related art sandwich core materials for such applications may be difficult to fabricate in curved shapes and sufficiently low densities. Thus, there is a need for a low-density structure that can readily be fabricated in a curved shape, and that is capable of withstanding high temperatures.

SUMMARY

Embodiments of the present invention include a lightweight sandwich panel structure with a complex shape and curvature, and a method to fabricate such a panel out of high temperature alloys that may be difficult to process into sandwich panels using related art methods. Embodiments of a micro-truss core structure that offer high specific strength and stiffness while allowing for curvature, and methods for depositing multiple layers of metals that can be interdiffused into complex alloys, are provided. An additional aspect of embodiments is that by fabricating a core of a panel from a polymer template, limitations on shape and curvature may be overcome, and by coating the polymer template, new core materials and low densities may be enabled. The architecture for the core may be designed for the coating processes, e.g., to overcome line-of-sight limitations and to minimize or reduce weak points introduced by hollow nodes.

According to an embodiment of the present invention there is provided an article, including: a core; and two facesheets secured to the core; the core including: a plurality of hollow first truss members extending in a first direction; and a plurality of hollow second truss members extending in a second direction; the truss members of the plurality of first truss members and the plurality of second truss members interpenetrating at a plurality of hollow nodes, each of the hollow nodes being immediately adjacent to, and secured to, one of the two facesheets, each of the truss members of the plurality of first truss members and the plurality of second truss members having: an outside diameter between 0.1 mm and 5 mm, a length between 3 mm and 50 mm, and a wall thickness between 1 micron and 1000 microns, wherein a hollow node is truncated, so that a saddle point of the hollow node is spaced from the facesheet to which it is immediately adjacent by a distance of less than one half of an outside diameter of a hollow truss member extending from the hollow node.

In one embodiment, the article includes a saddle point of the hollow node to the facesheet to which the hollow node is immediately adjacent.

In one embodiment, the article includes a hollow fourth truss member perpendicular to the two facesheets and interpenetrating one of the truss members of the plurality of first truss members and the plurality of second truss members at one of the plurality of hollow nodes.

In one embodiment, the core includes two interlaced tetrahedral structures.

In one embodiment, the article includes, as a major component, a substance selected from the group consisting of nickel, cobalt, iron, and combinations thereof; a second coating layer including chromium or NiCr, the second coating layer having a Cr thickness of 10-40% of the thickness of the first coating layer, a third coating layer of aluminum or NiAl, the third coating layer having a Al thickness of 10-40% of the thickness of the first coating layer.

In one embodiment, the article includes, as a major component, a substance selected from the group consisting of Mo, W, Ta, Ti, and Re, and combinations thereof.

In one embodiment, the article includes, as a major component, a substance selected from the group consisting of Si, C, B, Zr, Hf, and Y, and combinations thereof.

In one embodiment, a facesheet of the one or more facesheets has a radius of curvature between 5 cm and 10 m.

In one embodiment, a facesheet of the one or more facesheets has a radius of curvature greater than 10 m.

In one embodiment, a facesheet of the one or more facesheets has a first radius of curvature at a first point on the facesheet and a second radius of curvature at a second point on the facesheet, and the second radius of curvature differs by at least 30% from the first radius of curvature.

In one embodiment, a first facesheet of the one or more facesheets has a normal at a first point, and a second facesheet of the one or more facesheets has a normal at a second point opposite the first point, wherein the angle between the first normal and the second normal is less than 175 degrees.

In one embodiment, a feature selected from the group consisting of fasteners, bushings, inserts, and combinations thereof, is embedded in the core and in a facesheet of the one or more facesheets.

In one embodiment, a density of the core in a first region within the article is greater by 10% than a density of the core in a second region within the article.

In one embodiment, a truss member of the truss members of the plurality of first truss members and the plurality of second truss members has a cross-sectional shape selected from the group consisting of ovals, rectangles, and irregular shapes.

In one embodiment, the article includes: three standoffs secured to a first facesheet of the one or more facesheets, each of the three standoffs having a length between 1 cm and 10 cm, and a thermally insulating material adjacent to the first facesheet.

In one embodiment, the article includes a radiation barrier within the core.

In one embodiment, the article includes a thermally insulating material within the core.

In one embodiment, the one or more facesheets include a first curved facesheet and a second curved facesheet; the article has a shape of an airfoil, a flight control surface, or a leading edge; each of the truss members of the plurality of first truss members and the plurality of second truss members has a wall thickness between 30 microns and 500 microns; the wall thickness is between 0.01 and 0.1 times the outside diameter; and the truss members of the plurality of first truss members and the plurality of second truss members interpenetrate at a plurality of hollow nodes.

In one embodiment, each of the hollow nodes is immediately adjacent to, and secured to, a facesheet of the one or more facesheets.

In one embodiment, the article includes an internal sheet in the core, wherein each of the hollow nodes is immediately adjacent to, and secured to: a facesheet of the one or more facesheets, or the internal sheet.

According to an embodiment of the present invention there is provided a method for forming a structure including walls thinner than 0.5 mm, the method including: forming a polymer template; coating the template with a first coating layer including a metal; coating the template by electroplating with a second coating layer including one or more chemical elements selected from the group consisting of Ni, Co, Fe, Cu, Cr, Zn, Sn, Pb, Cd, Ag, Au, Pd, Pt, Rh, Mn, and Ir, the composition of the second coating layer being different from the composition of the first coating layer; removing the polymer template to form a first hollow thin-walled structure; coating the first hollow thin-walled structure with a third coating layer including one or more chemical elements to form a second hollow thin-walled structure performing a heat treatment of the second hollow thin-walled structure to form a third hollow thin-walled structure, the performing of the heat treatment including heating the hollow structure to a first temperature and maintaining the temperature of the hollow structure at or above the first temperature during a first time interval, the first temperature and the first time interval being selected such that the heat treatment causes the elements of the first coating layer, the elements of the second coating layer, and the elements of the third coating layer to interdiffuse to form a single continuous layer including one or more chemical elements, the concentration of each chemical element of the continuous layer varying by less than 10% within the continuous layer.

In one embodiment, the forming of the template includes: forming a plurality of first truss members defined by a plurality of first self-propagating polymer waveguides and extending along a first direction; forming a plurality of second truss members defined by a plurality of second self-propagating polymer waveguides and extending along a second direction; and forming a plurality of third truss members defined by a plurality of third self-propagating polymer waveguides and extending along a third direction.

In one embodiment, the forming of the template includes utilizing an act selected from the group consisting of stereolithography, three dimensional (3D) printing, additive manufacturing and injection molding.

In one embodiment, the act of coating the template with the first coating layer includes utilizing an act selected from the group consisting of electroplating, electroless plating, chemical vapor deposition, physical vapor deposition, spray coating, and combinations thereof.

In one embodiment, the act of: coating the first hollow thin-walled structure with the third coating layer includes utilizing an act selected from the group consisting of aluminum diffusion coating, chromium diffusion coating, titanium diffusion coating and pack cementation.

In one embodiment, the removing of the template includes utilizing an act selected from the group consisting of a base etching, an acid etching, a plasma etching, a solvent bath processing, a thermal decomposition and a melting.

In one embodiment, the first temperature is at least 1100° C. and the first time interval is at least 24 hours.

In one embodiment, the method includes joining two facesheets to a top surface and a bottom surface of the third hollow thin-walled structure, utilizing an act selected from the group consisting of brazing, transient liquid bonding, welding, and adhesive bonding.

In one embodiment, the method includes, rendering the template conductive with a first sub-layer; and depositing a 5 to 300 micron thick second sub-layer on the template, the second sub-layer including as a major component, a substance selected from the group consisting of nickel, cobalt, iron, and combinations thereof, and wherein the method further includes, after the removing of the template: depositing one or more layers of chromium, to a combined thickness of 10% to 40% of the thickness of the first layer, utilizing an act selected from the group consisting of electroplating, chemical vapor deposition and pack cementation; depositing one or more layers of aluminum, to a combined thickness of 10% to 40% of the thickness of the first layer, utilizing an act selected from the group consisting of electroplating, chemical vapor deposition and pack cementation; depositing, to a thickness of 1% to 15% of the thickness of the first layer, a layer including, as a major component, a substance selected from the group consisting of Mo, W, Ta, Ti, and Re, and combinations thereof; and depositing, to a thickness of less than 2% of the thickness of the first layer, a layer including, as a major component, a substance selected from the group consisting of Si, C, B, Zr, Hf, Y, and combinations thereof.

In one embodiment, the first coating layer is metallic and renders the template conductive, and the second coating layer includes, as a major component, a combination of: cobalt; and rhenium in a concentration of 10 to 70 percent by weight (wt. %); the coating of the template with the second coating layer includes utilizing electroplating; the third coating layer includes, as a major component, a substance selected from the group consisting of chromium, nickel, aluminum, tantalum, silicon, and combinations thereof; and the coating of the template with the third coating layer includes utilizing an act selected from the group consisting of electroplating, chemical vapor deposition, and pack cementation.

In one embodiment, the method includes, rendering the template conductive with a first sub-layer; and depositing a 5 to 300 micron thick second sub-layer on the template, the second sub-layer including, as a major component, a substance selected from the group consisting of nickel, cobalt, iron, and combinations thereof; and the coating with the third coating layer includes depositing a metal alloy utilizing an act selected from the group consisting of cathodic arc deposition, direct current (DC) bias field cathodic arc physical vapor deposition, and plasma enhanced magnetron sputtering.

In one embodiment, the method includes removing the first and second coating layer with a selective etch.

BRIEF DESCRIPTION OF THE DRAWINGS

The file of this patent contains at least one drawing executed in color photography. Copies of this patent with color photographs will be provided by the Patent and Trademark Office upon request and payment of necessary fee. Features, aspects, and embodiments are described in conjunction with the attached drawings, in which:

FIGS. 7A-7D are lamination diagrams showing deposited layers according to embodiments of the present invention;

DETAILED DESCRIPTION

The detailed description set forth below in connection with the appended drawings is intended as a description of exemplary embodiments of a curved high temperature alloy sandwich panel with a truss core and fabrication method provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

One embodiment of this invention is a curved acreage thermal protection system (TPS) with a cobalt-rhenium alloy core that may be capable of withstanding 30% higher temperatures than a related art metallic TPS based on nickel alloy honeycomb, while offering lighter weight and the complex shapes necessary for many applications. Embodiments of the present invention provide lightweight sandwich panels that can be fabricated from high temperature alloys. Curved panels and complex shapes may be fabricated using the disclosed methods, and very low densities may be achieved, since the alloy may be deposited as a thin coating instead of being rolled from a cast block to thinner and thinner sheets.

For example, the related art sheet rolling approach used to manufacture honeycomb cores limits the available alloys since many high temperature alloys are not ductile enough to allow rolling them into thin sheets.

Fasteners may be embedded in panels fabricated according to embodiments of the present invention. The core may be open-celled which has advantages for multifunctionality, such as thermal management, over related art structures such as closed-celled honeycombs or foams. With embodiments of the present invention it may be possible to grade the core density and increase strength and stiffness in certain locations, e.g. around fasteners or where high loads occur, while reducing density and saving weight, where it is not needed.

Figure 1:
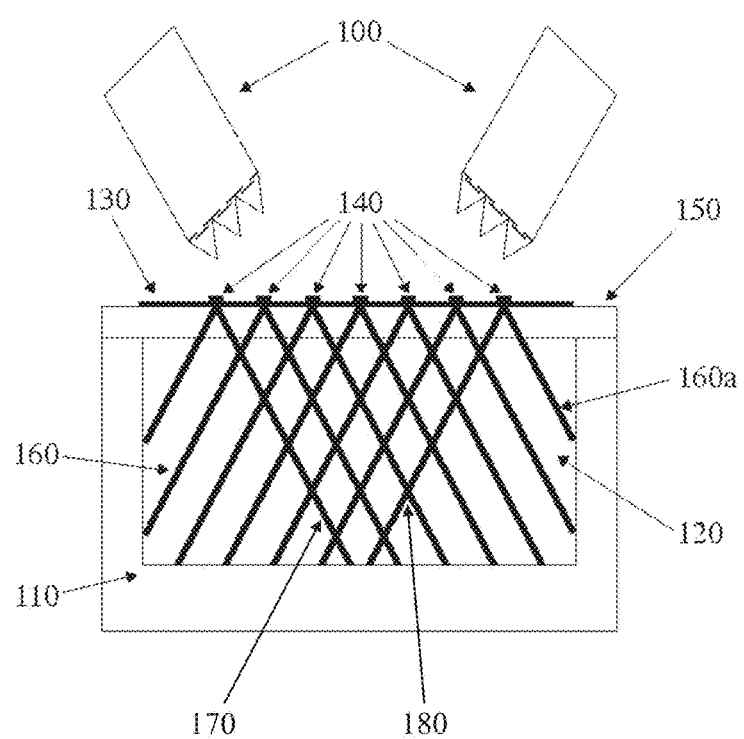
FIG. 1 is a schematic diagram of a system for forming a core template according to an embodiment of the present invention.

Referring to FIG. 1, in one embodiment a truss core is formed by first forming a polymer micro-truss, according, for example, to a method disclosed in the '959 patent. A polymer core template is formed by using a fixed light input (collimated UV light) to cure (polymerize) polymer optical waveguides, which can self-propagate in a three-dimensional (3D) pattern. Some liquid monomers, referred to as photomonomers, polymerize when exposed to light (e.g., UV light), and undergo a refractive index change during the polymerization process. The refractive index change can lead to a formation of polymer optical waveguides. If a monomer that is photo-sensitive is exposed to light (typically UV) under the right conditions, the initial area of polymerization, such as a small circular area, will "trap" the light and guide it to the tip of the polymerized region, further advancing that polymerized region. This process will continue, leading to the formation of a self-propagating photopolymer waveguide structure with approximately (about) the same cross-sectional dimensions along its entire length.

With reference to FIG. 1, a system for forming a 3D polymer core template according to an embodiment of the present invention includes one or more collimated light sources 100, a reservoir (mold) 110 having a volume of photomonomer resin 120 that will polymerize at a wavelength of collimated light beams provided by the light sources 100, and a patterning apparatus, such as a mask 130 with multiple apertures (open areas) 140.

Each of the apertures 140 has a given shape and dimension substantially matching a cross section geometry of a waveguide (e.g., waveguide 160a). Between the mask 130 and the monomer 120, there may be a substrate 150. Here, in FIG. 1, a truly 3D network can be formed because the intersecting polymer waveguides 160 will simply polymerize together, but will not interfere with waveguide propagation. Also, the spacing between the plurality of waveguides 160 corresponds with the pattern of the plurality of apertures 140. The pattern of the apertures 140 may, for example, be in a square pattern or in a hexagonal pattern. The hole (aperture) diameter and spacing, in the mask 130, and the number of waveguides 160 formed from each of the apertures 140 may be adjusted to adjust the open volume fraction (i.e. open space) of the formed 3D core template. These characteristics may be constant or may vary, as a result of corresponding variations in the mask hole size, shape, or spacing, across the core template. The core template formed in this manner may be a periodic or quasi-periodic structure, composed of unit cells including truss members 170 interpenetrating at nodes 180. The depth of the reservoir may be selected to correspond to the thickness of the core template to be formed.

When a core template has been formed within the reservoir of photomonomer, the core template may be removed from the reservoir, and the excess photomonomer may be allowed to drain off of the core template. In one embodiment the core template is extracted from the reservoir and cleaned utilizing a hot air process. Hot air, e.g., air between 30° C. to 120° C., is blown over the core template with a pressure 5 pounds per square inch gauge (PSI gauge) to 100 PSI gauge to remove excess photomonomer resin. During this process the core template can be suspended over a porous support such as a grate to allow resin to drop away or on a porous support such as paper towels to absorb the excess resin. In this state the core template is referred to as a green state core template, which may be flexible and amenable to being molded or shaped.

The green state polymer core template may be molded or shaped to form a shape different from a flat sheet. This may be accomplished, e.g., by placing the green state core template into a suitable mold composed of two halves, and pressing the halves together with enough force to cause the green state polymer micro-truss structure to assume the shape of the space left between the halves. In other embodiments the green state core template may be shaped by hand or using tools, or the green state core template may be draped over a curved surface and caused by gravity to conform to the surface. In other embodiments the green state core template is shaped by a process selected from the group consisting of bending, stretching, impressing, embossing and combinations thereof. Once the green state polymer micro-truss structure has been shaped, it may be post-cured while being held in place, e.g., by again exposing the green state core template to ultraviolet (UV) light, or by heating it in an inert environment. For UV light curing, a Fusion Box with an H+ bulb, available from Hereaus Noblelight America, of Gaithersburg, Md., may be used, and the green state core template may for example be exposed to UV light with an irradiance of about 100 mW/cm$^2$ for 2 minutes. To post-cure the green state core template using heat, it may for example be heated to 160° C. in vacuum or nitrogen atmosphere. A post-cure process using UV light may be followed by a second post-cure process using heat. The post-curing process completes the crosslinking of the monomers forming the core template. Once post-cured, the core template is referred to as a cured core template, and it may be sufficiently rigid to reliably hold its shape.

In other embodiments a cured core template may be shaped (after curing) by heating it above the glass transition temperature of the polymer, bending it, and cooling it to fix the curvature.

Figure 2A:
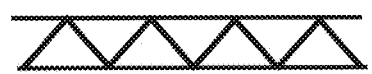
FIGS. 2A-2I are schematic cross sectional views of sandwich structures according to embodiments of the present invention.
Figure 2B:
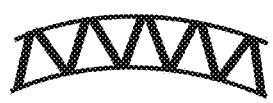
Figure 2C:
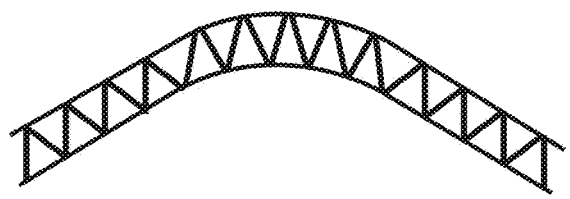
Figure 2D:
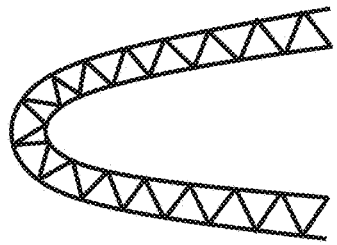

A cured core template formed in this manner may be coated with metal, and the core template may then be removed, e.g., by etching, to leave a hollow metal structure or "truss core". Other processing acts may be used as described in further detail below. Referring to FIG. 2A, a sandwich panel may be formed by securing two facesheets to a truss core, e.g., a sheet of hollow metal truss. If the core template is formed into a curved shape before curing, then the truss core may have a correspondingly curved shape, to which curved facesheets may be secured, to form sandwich structures such as those illustrated in FIGS. 2B-2D. The embodiment of FIG. 2D may be suitable, for example, for use as a blunt leading edge in an aerospace vehicle. As used herein, a "facesheet" is a sheet secured to an exterior surface of a truss core. A "sheet" as used herein is a solid shape that has two major surfaces that are locally substantially parallel, the surface area of the two major surfaces being at least 80% of the total surface area of the sheet.

The strength of the sandwich panel may be greater when, as illustrated in FIGS. 2A-2D, all of the hollow nodes of the truss core are on, or directly adjacent to, a facesheet, with no nodes being within the bulk of the truss core, away from the facesheets. Such hollow nodes that are not directly on a facesheet, i.e. "unconstrained" nodes, may act as buckling initiation sites and lower the strength of the core. A core structure may be, for example, a pyramidal truss configuration where three or four struts or "truss members" meet at a node that is in contact with either the top or bottom facesheet.

Figure 2E:
Figure 2F:
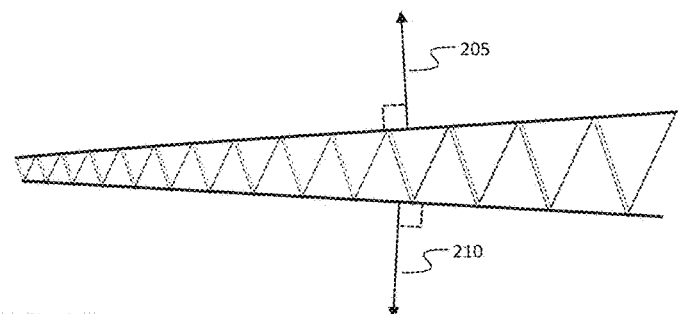
Figure 2G:
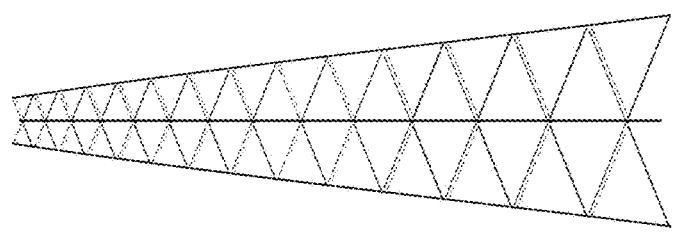

Truss cores and sandwich panels may be fabricated with graded cores, e.g., by using a mask with graded aperture spacing and a reservoir with a sloping bottom. Referring to FIG. 2E, a truss core with node spacing of the truss core and thickness of the truss core increasing in a graded manner from left to right, for example, may be used to form a tapered sandwich panel (FIG. 2F) or a tapered sandwich panel with an internal sheet (FIG. 2G). Facesheets in such a structure, e.g., the structure of FIG. 2F may not be parallel. A first facesheet may have a first outward-pointing normal vector (or "normal") 205, and a second facesheet may have a second outward-pointing normal 210, and the first and second normal vectors may not be parallel, i.e., the angle between them may not be 180 degrees. In one embodiment the angle between the first normal and the second normal is less than 175 degrees. Such structures may be used as a part of a leading edge or flight control surface. As in the embodiments of FIGS. 2A-2D, truss members interconnect at nodes, and the nodes at the bottom are connected to a first sheet, while the nodes at the top are connected to a second sheet, and the structure has no freestanding nodes not connected to either a facesheet or an internal sheet, such as the internal sheet of FIG. 2G. Freestanding hollow nodes may be weak points; the facesheets constrain the nodes and thereby may increase the stiffness and strength of the core.

Figure 2H:
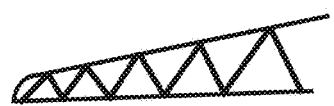
Figure 2I:

A truss core may be fabricated using a coating process, like sputtering or physical vapor deposition, that is somewhat restricted to deposition in the line-of-sight, or a process, like electrodeposition, that depends on an electric field between the surface to be coated and an anode. A single-layer truss structure in which the cores provide good line-of-sight access to the surfaces of the truss members and nodes (like the structures illustrated in FIGS. 2A-2F) may be well suited for fabrication using these processes. Multiple single-layer cores may then be combined with one or more internal sheets and facesheets to form multi-layer sandwich structures such as the one of FIG. 2G. FIG. 2H shows a graded core with a single, wrap-around curved facesheet, and FIG. 2I shows a structure, also with a single, wrap-around curved facesheet, and a dual-graded core, in which the node spacing first increases, and then decreases, in proceeding from left to right.

Figure 3A:
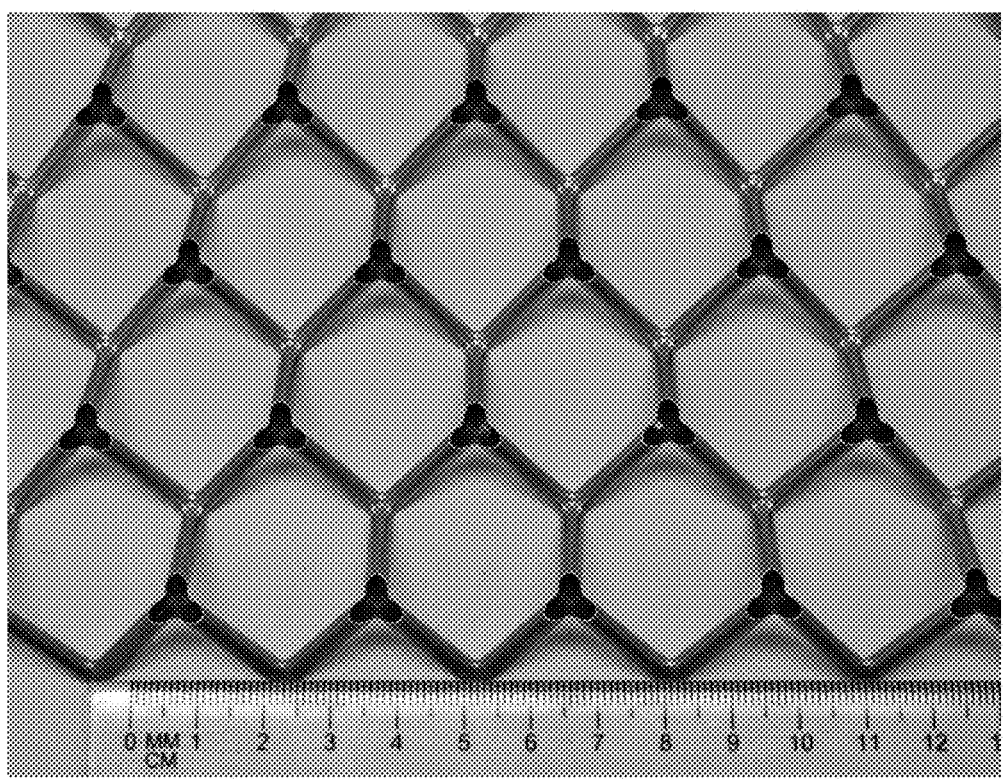
FIG. 3A is a perspective view of a truss core according to an embodiment of the present invention.
Figure 3B:
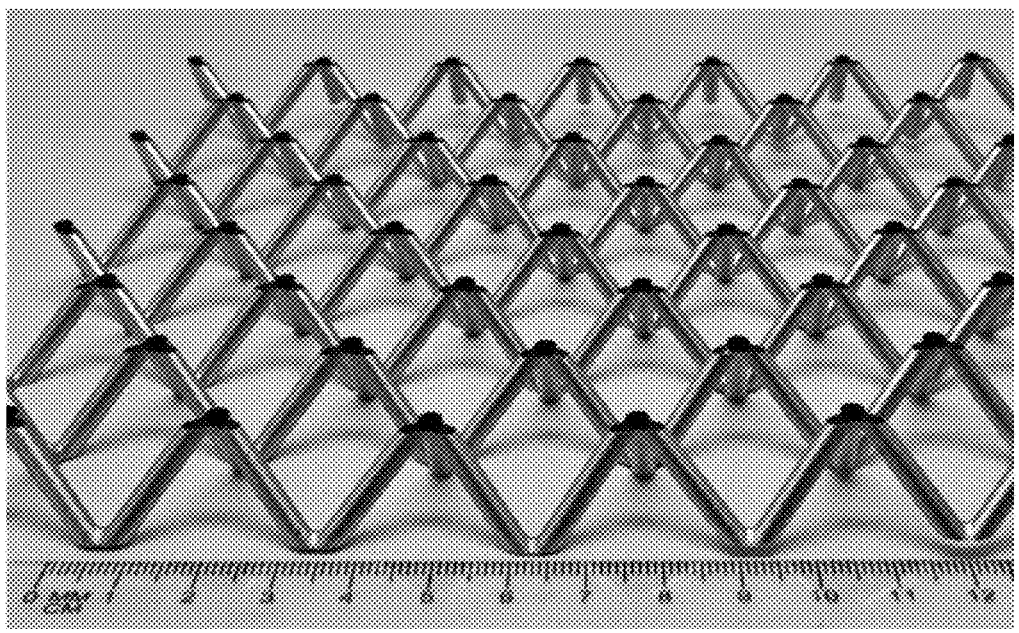
FIG. 3B is an enlarged perspective view of the truss core of FIG. 3A.
Figure 3C:
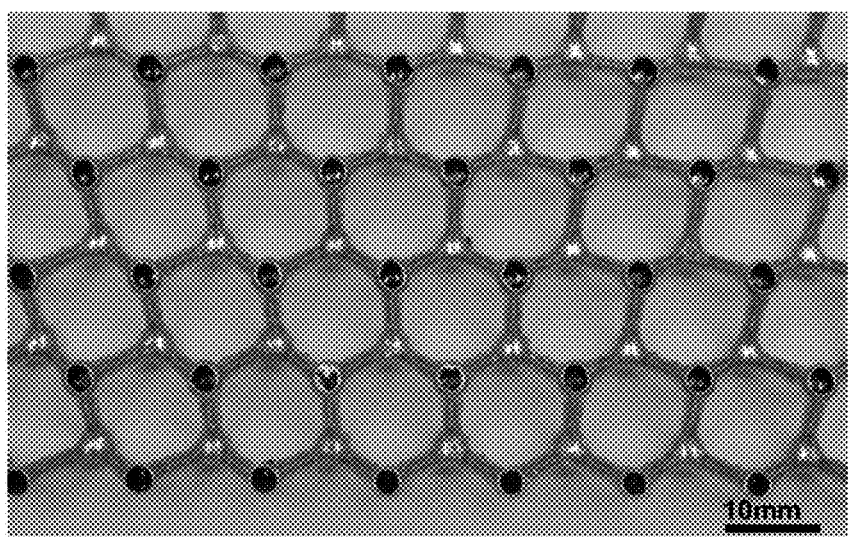
FIG. 3C is a top view of the truss core of FIG. 3A.
Figure 3D:
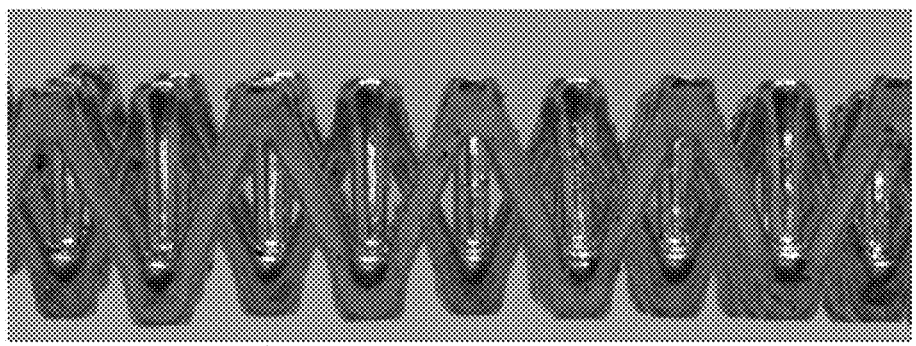
FIG. 3D is a front view of the truss core of FIG. 3A.
Figure 3E:
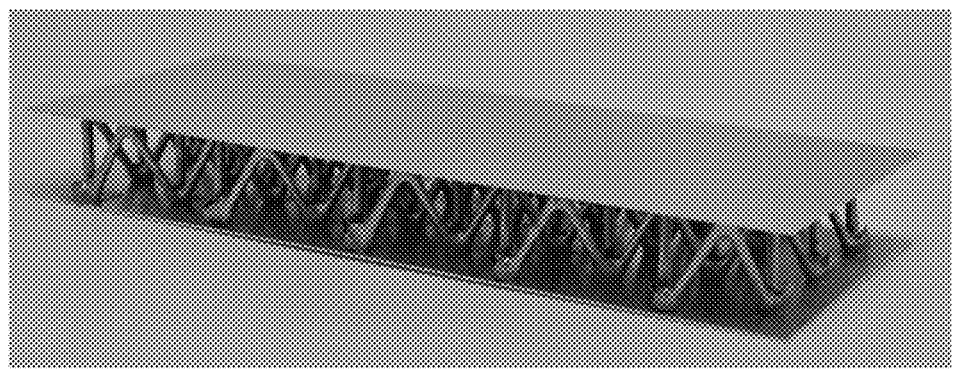
FIG. 3E is a perspective view of a sandwich using the truss core of FIG. 3A.

FIGS. 3A and 3B show two views of a hollow tetrahedral metallic truss core with truncated nodes. FIGS. 3C and 3D show two views of a hollow tetrahedral metallic truss core with standard nodes (no truncation) and a different truss member length and diameter as compared to FIG. 3A. The truss cores were fabricated by making a pyramidal polymer core template using the self-propagating photopolymer waveguide method described above and in the '959 patent. The core template was coated with a thin Ni—P layer by electroless nickel plating to render it conductive. The nodes at the top and bottom were then sanded to remove the coating and expose the polymer. An approximately (about) 50 micrometer thick nickel layer was added by standard electroplating in a nickel sulfamate bath. The polymer template was then etched away with a 1.5 M NaOH solution to achieve a hollow nickel truss core with a density of approximately 30 kg/m³. The tetrahedral truss core in FIGS. 3A-3D exhibits 3-fold symmetry; three truss members meet at each node. FIG. 3E shows a sandwich made by a adding two facesheets to the core of FIGS. 3A-3D.

Figure 4A:
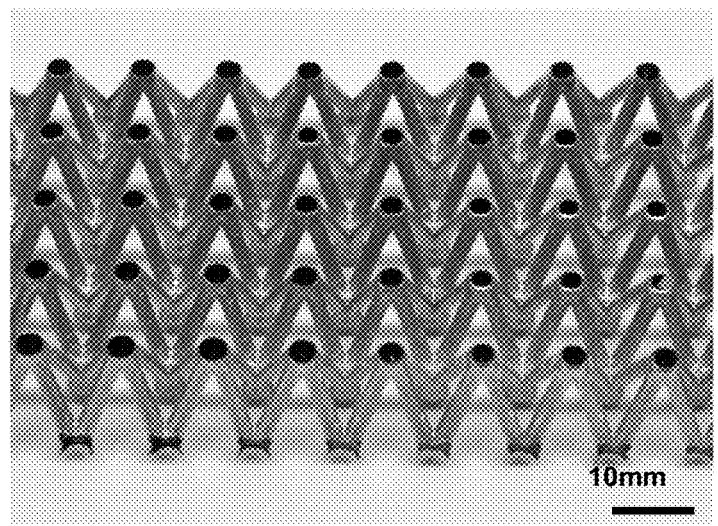
FIG. 4A is a perspective view of a truss core according to another embodiment of the present invention.
Figure 4B:
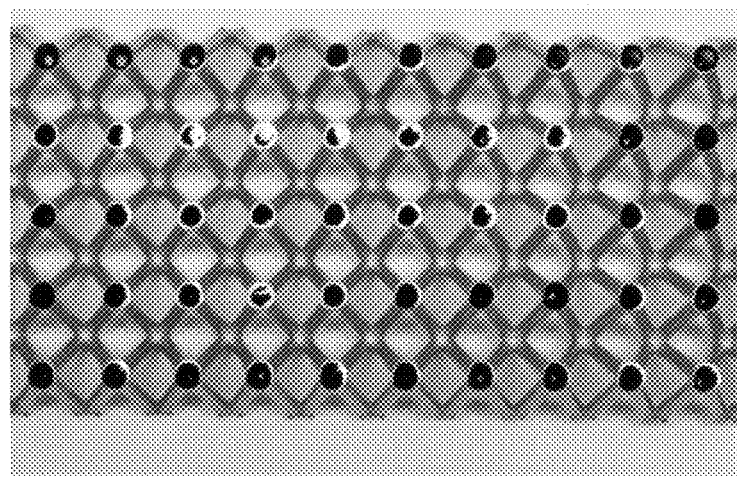
FIG. 4B is a top view of the truss core of FIG. 4A.
Figure 4C:
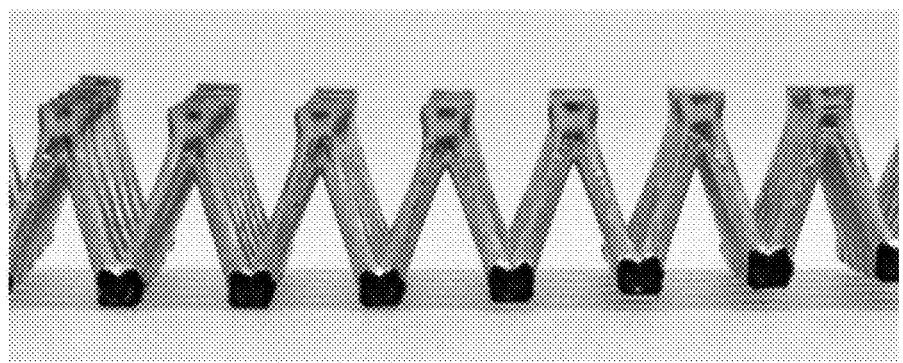
FIG. 4C is a front view of the truss core of FIG. 4A.

FIGS. 4A-4C show three views (perspective view, FIG. 4A, top view, FIG. 4B, and front view, FIG. 4C) of a pyramidal truss core with 4-fold symmetry, in which four struts meet at each node. While a structure with 3-fold symmetry (e.g., the structure of FIGS. 3A-3D) may make more uniform coating coverage possible, around the nodes and especially under the nodes, the 4-fold symmetry of the structure of FIGS. 4A-4C may provide greater shear stiffness and strength in a specific direction. The core architecture for both embodiments (that of FIGS. 3A-3D and that of FIGS. 4A-4C) is referred to as pyramidal, since the hollow truss members lie along the edges of imaginary pyramids with 3 or 4 sides and do not cross over to form a full lattice with unconstrained nodes.

Figure 5A:
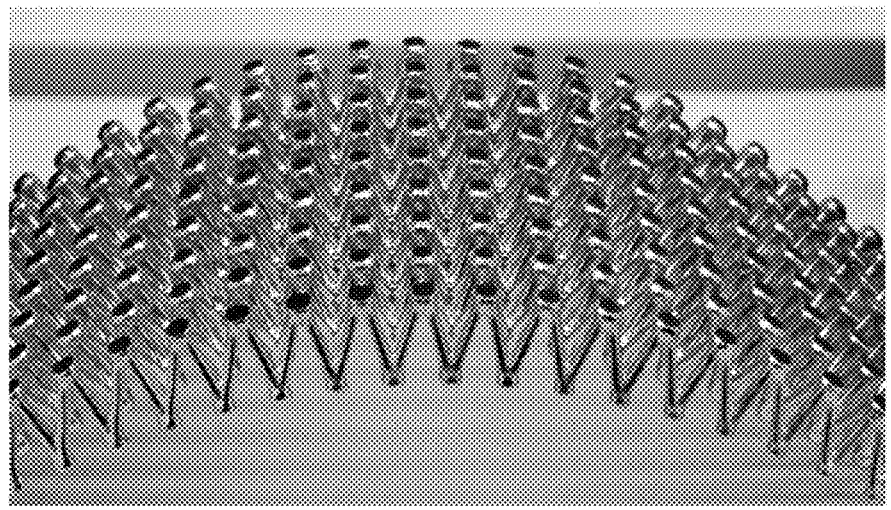
FIG. 5A is a perspective view of a curved truss core according to another embodiment of the present invention.
Figure 5B:
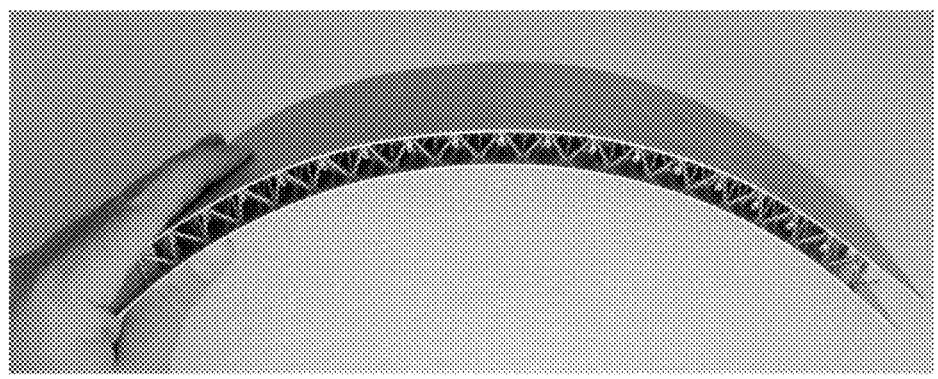
FIG. 5B is a perspective view of a sandwich using the truss core of FIG. 5A.
Figure 5C:
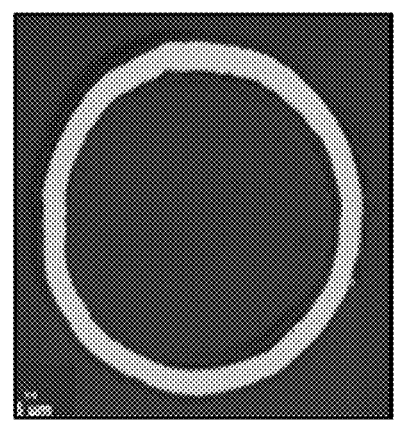
FIG. 5C is a photomicrograph of a cross section of a truss member of the truss core of FIG. 5A.

FIG. 5A shows a curved truss core. This core was fabricated curved, by curving the polymer template via heating it above the glass transition temperature of the polymer, bending it, and cooling it to fix the curvature. The curved polymer template was then coated with nickel by electroplating. Facesheets were subsequently bonded to the core with epoxy adhesive, to form the curved sandwich structure of FIG. 5B. FIG. 5C shows a cross section of a truss member of the embodiment of FIGS. 5A and 5B. In other embodiments, hollow metallic pyramidal truss cores can be bent to assume a curvature, since the pyramidal architecture may be capable of being bent into a curved shape without being damaged.

The openness of a pyramidal truss core template may enable fairly uniform coating, even with methods that are not entirely non-line-of-sight, such as electroplating and physical vapor deposition. When electroplating is used, the electroplating process parameters may be adjusted to maximize the throwing power, so that every part of the surface will be coated and the overall coating thickness may be reasonably uniform. The coating may be thicker at the locations that extend towards the electrodes and are not shielded from the flow of metal ions, which in the case of flat pyramidal cores may be the nodes. A thicker coating at the nodes may increase strength, since the nodes may concentrate stresses. Good coating coverage and thickness uniformity may be achieved using electron beam evaporation and sputtering using a rotary, 3-dome planetary fixture to continuously change the truss core's angle with respect to the evaporant stream, and flipping the core over halfway through the deposition. In another embodiment, direct current (DC) bias field cathodic arc physical vapor deposition is used to apply a metal coating; in this method a voltage bias applied to the structure improves non-line-of-sight deposition by attracting metal ions and charged particles. This method also allows deposition of thicker coatings (e.g. 50 microns thick in 2 hours).

Figure 9:
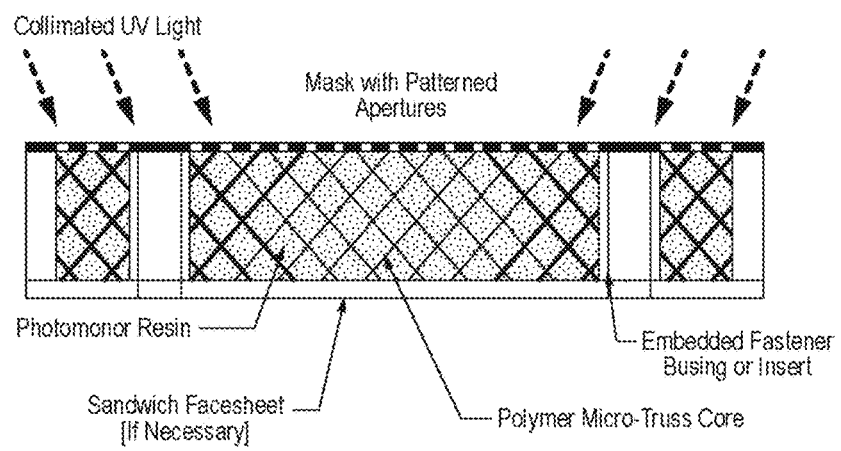
FIG. 9 is a schematic diagram of a system for forming a core template with additional features according to an embodiment of the present invention.

Beyond the pyramidal truss core, other core architectures, e.g., truss cores with oval, rectangular or irregular shaped struts, may also be coated as described above. The truss members may intersect at unconstrained nodes in the interior, forming a structure with multiple unit cells through the thickness as shown in FIG. 9. In some embodiments, the core template is fabricated by three-dimensional (3D) printing; in this case other features, such as a post, a wall or an odd shaped feature connecting the two facesheets can be added, as well as separation walls to separate areas from each other. The more line-of-sight limited the coating method is, the more difficult it may be to achieve uniform coating thickness on cores where regions in the interior are in the shade of outer features. Coating processes like electroless plating, atomic layer deposition, chemical vapor infiltration and chemical vapor deposition may however have the ability to deposit structures with multiple unit cells through the thickness, such as the structure of FIG. 9.

Figure 6:
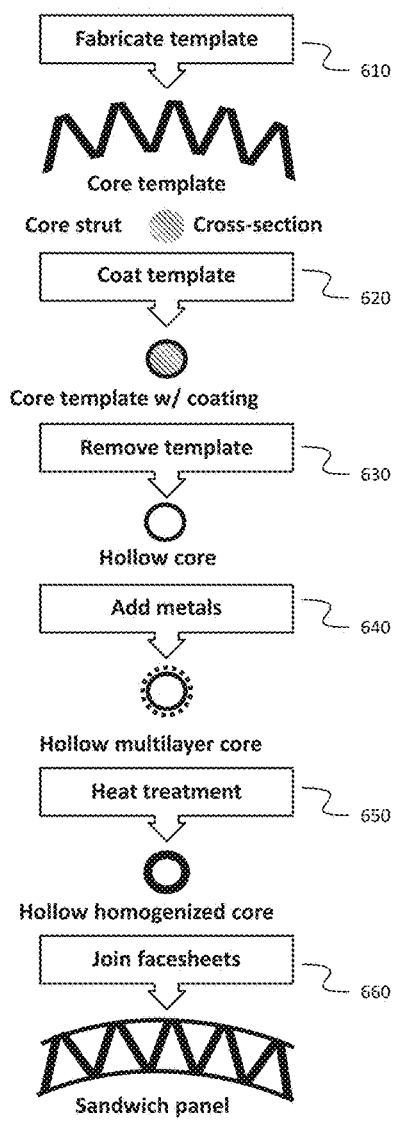
FIG. 6 is an illustrated flow chart of a method for fabricating a sandwich panel according to an embodiment of the present invention.

FIG. 6 shows a flow chart of a method, according to one embodiment, to fabricate a curved high temperature alloy sandwich panel with a truss core. In an act 610, a core template is fabricated, e.g., out of polymer material by additive manufacturing, for example by 3D printing, by stereolithography or by a self-propagating photopolymer waveguide method such as that taught by the '959 patent. Alternatively the template may be fabricated from any other material that lends itself to being coated. The core may be fabricated in a complex, curved shape or may be fabricated as a flat sheet and shaped afterwards. A thermoset polymer core template may be shaped to a certain curvature by heating the polymer above the glass transition temperature, shaping it and then cooling it to make the change in shape permanent.

In an act 620, the template is coated, and in an optional act 630 the template is removed with a base etch, acid etch, plasma etch or solvent bath. The coating may be strong enough to survive free-standing and the coating may be compatible with the process used to remove the template. The template may be coated by electroplating, electroless plating, chemical vapor deposition, physical vapor deposition, slurry coating, dip coating, or another method. To enable electroplating, the polymer template may first be rendered conductive by depositing a thin nickel, chromium, cobalt, or other metal layer by physical vapor deposition, electron beam evaporation, sputtering, or electroless plating. In one embodiment, the first coating is a relatively thick layer of electroplated nickel, cobalt or copper, and the template is then removed by a base etch, e.g., an etch with 1.5M NaOH.

The act 630 of removing the template is optional. A hollow core structure may have lower density, but in cases where density is not critical, the template may be left in the core. Leaving the template in the core will suppress local buckling of the hollow struts, which can increase specific strength in some cases, especially if the core contains multiple layers of cells and unconstrained nodes.

In an act 640, additional chemical elements are added. This step is optional, and in some embodiments, the additional elements are added before the removal of the core template. The additional elements may be added with controlled thicknesses to achieve the volume or weight fraction corresponding to an alloy formed in an act 650. In one embodiment, the coating act 620 includes rendering the template conductive with a first sub-layer, and depositing a 5 to 300 micron thick second sub-layer on the template, the second sub-layer including, as a major component, a substance selected from the group consisting of nickel, cobalt, iron, and combinations thereof. The act 640 may include, after removing the template: depositing one or more layers of chromium, to a combined thickness of 10% to 40% of the thickness of the first layer, utilizing an act selected from the group consisting of electroplating, chemical vapor deposition and pack cementation; depositing one or more layers of aluminum, to a combined thickness of 10% to 40% of the thickness of the first layer, utilizing an act selected from the group consisting of electroplating, chemical vapor deposition and pack cementation; depositing, to a thickness of 1% to 15% of the thickness of the first layer, a layer including, as a major component, a substance selected from the group consisting of Mo, W, Ta, Ti, and Re, and combinations thereof; and depositing, to a thickness of less than 2% of the thickness of the first layer, a layer including, as a major component, a substance selected from the group consisting of Si, C, B, Zr, Hf, Y, and combinations thereof. In one embodiment, the first coating layer is metallic and renders the template conductive, and a second coating layer includes, as a major component, a combination of cobalt and rhenium in a concentration of 10 to 70 percent by weight (wt. %); the coating of the template with the second coating layer includes utilizing electroplating; a third coating layer includes, as a major component, a substance selected from the group consisting of chromium, nickel, aluminum, tantalum, silicon, and combinations thereof; and the coating of the template with the third coating layer includes utilizing an act selected from the group consisting of electroplating, chemical vapor deposition, and pack cementation. In another embodiment, the template is coated with three layers, and the coating of the template with a first coating layer includes: rendering the template conductive with a first sub-layer; and depositing a 5 to 300 micron thick second sub-layer on the template, the second sub-layer including as a major component, a substance selected from the group consisting of nickel, cobalt, iron, and combinations thereof; and the coating with the third coating layer includes depositing a metal alloy utilizing an act selected from the group consisting of cathodic arc deposition, direct current (DC) bias field cathodic arc physical vapor deposition, and plasma enhanced magnetron sputtering.

A heat treatment is then performed, in act 650, to interdiffuse the different coating layers and achieve a homogenized alloy. The temperature of the heat treatment is chosen to achieve timely equilibration of the coating. Intermittent heat treatments can be performed to promote interdiffusion before adding additional elements. In one embodiment the heat treatment includes heating the hollow truss core to at least 1100° C. (e.g., to 1200° C.) for 24 hours. After the act 650 of heat treating the hollow truss core, the separately deposited layers of metals or other elements may be interdiffused to the extent that they form one continuous layer. As used herein, a continuous layer is a layer which the concentration of each elemental component of the layer is continuous throughout the layer, i.e., does not change discontinuously at any point within the layer. In several stacked layers with different compositions, by contrast, the concentrations of one or more elemental components may change discontinuously at inter-layer boundaries. In one embodiment, the concentration of each element of the continuous layer (i.e., the layer formed during the act 650 of heat treating the hollow truss core) varies by less than 5% within the continuous layer. In one embodiment, the continuous layer formed by the act 650 of heat treating the hollow truss core contains, as a major component, an element selected from the group consisting of nickel, cobalt, refractory elements, and combinations thereof. As used herein, the term "refractory element" includes niobium, molybdenum, tantalum, tungsten, rhenium, titanium, vanadium, chromium, zirconium, hafnium, ruthenium, osmium and iridium.

After the core is fabricated, facesheets may be attached, in an act 660, by brazing, diffusion bonding, transient liquid bonding (e.g., transient liquid phase diffusion bonding), welding (e.g., solid state welding or resistance welding), adhesive bonding, or electrojoining. In one embodiment a facesheet contains, as a major component, an element selected from the group consisting of nickel, cobalt, refractory elements, and combinations thereof.

FIGS. 7A-7D show four different possible coating stacks for different core alloys. FIG. 7A shows coatings that may be deposited for a nickel or cobalt based superalloy. In one embodiment, the polymer template is rendered conductive by depositing a thin layer (0.1-1 micron) of nickel or cobalt by electron beam evaporation. This deposition technique may be used instead of electroless nickel plating because electroless nickel plating may introduce phosphorous. To introduce small amounts of Mo, W, Ta, Ti, Re, Si, C, B, Zr, Hf, and/or Y into the targeted alloy, these elements may be deposited in the appropriate thickness first and then capped with 100 nm layer of nickel or cobalt to facilitate plating of the subsequent layer or layers. Subsequently standard electroplating may be used to build up a relatively thick layer of nickel or cobalt. Then layers of chromium and aluminum with a thickness needed to achieve the target alloy composition are added by pack cementation, chemical vapor deposition (CVD) or electroplating, e.g., to a thickness between 10% and 40% of the thickness of the nickel or cobalt layer. If desired, optional elements like Mo, W, Ta, Ti and/or Re can be added with a thickness between 1% and 15% of the thickness of the nickel or cobalt layer. Trace elements, e.g., Si, C, B, Zr, Hf, and/or Y can also be added by physical vapor deposition (PVD) or CVD.

FIGS. 7B and 7C show coatings that may be deposited to fabricate a core out of a high temperature cobalt-rhenium based alloy. Cobalt and rhenium can be co-deposited by electroplating using cobalt sulfate and potassium perrhenate forming a base coating that has higher temperature capability than nickel or cobalt. Layers of chromium and other alloying elements may then be added.

FIG. 7D shows the coating stack if making a core out of a complex alloy using DC bias field cathodic arc physical vapor deposition (CA PVD). A conductive, robust metal coating may be applied to the polymer template first, typically nickel, cobalt, iron or copper by electroplating. Then a complex alloy can be deposited by CA PVD, for example C-103, which is 89% Nb, 10% Hf and 1% Ti, or C-129Y (10% tungsten, 10% hafnium, 0.1% yttrium, balance niobium), or almost any other complex alloy. CA PVD is a versatile process that allows deposition of many alloys. The first coating can be left in place, interdiffused with the second layer, or etched out, e.g., Cu may be etched out with HNO3.

Figure 8:
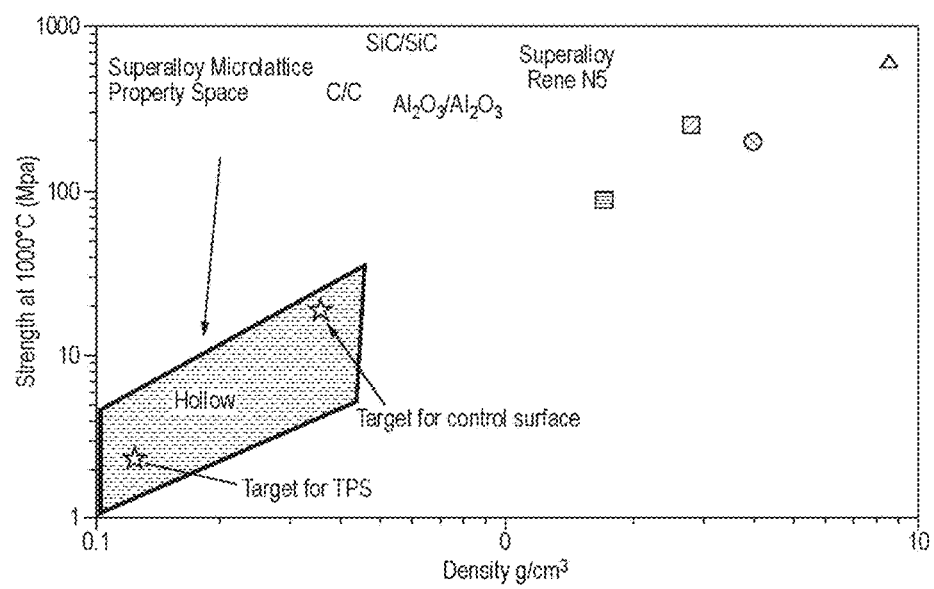
FIG. 8 is a chart of strength as a function of density of related art materials and of embodiments of the present invention.

FIG. 8 shows the calculated high temperature strength and density of nickel superalloy truss core sandwich panel cores in comparison to state of the art high temperature materials. It can be seen that such nickel superalloy cores achieve very low densities while maintaining good strength.

Figure 10:
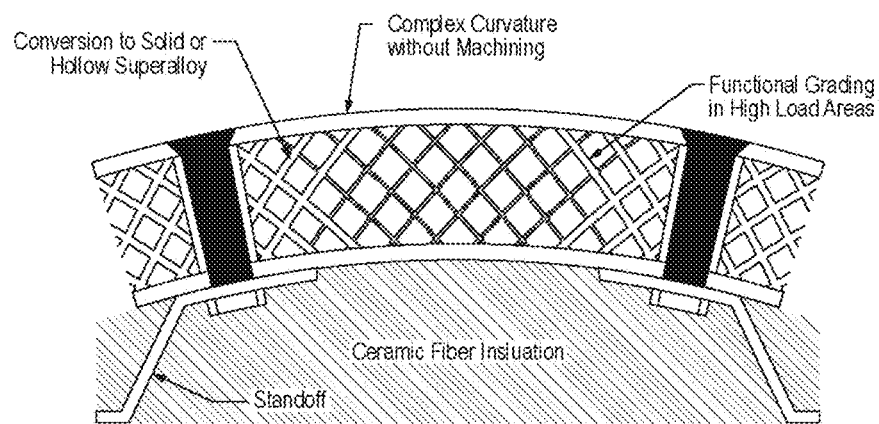
FIG. 10 is a cross-sectional view of a sandwich structure on standoffs according to an embodiment of the present invention.

FIGS. 9 and 10 relate to a curved high temperature alloy sandwich panel with a truss core for application in an acreage thermal protection system according to one embodiment. FIG. 9 shows a schematic of the fabrication of a micro-truss core with embedded features such as fasteners, bushings or inserts using a self-propagating photopolymer waveguide method (e.g., the method of the '959 patent). These features are embedded in photomonomer resin and then the resin is exposed through a mask with patterned apertures. Under each aperture a polymer waveguide forms. The mask pattern can be graded to form stronger and denser micro-truss around the fasteners or in areas where strength is needed. After exposure the remaining liquid resin is washed out and the polymer template including the fasteners is processed, e.g., according to acts 620-660 of the method of FIG. 6. To achieve the curvature shown in FIG. 10, the panel may for example be bent in the polymer stage.

To express relationships between the characteristics of the core structure, the following definitions are used:

D: strut outer diameter
t: wall thickness
$A = \pi t(D-t)$: strut cross sectional area $$I = \frac{A(D^2 - 2Dt + 2t^2)}{8}:$$

strut area moment of inertia

H: height of the truss structure (i.e., the separation between the facesheets)
L: unit cell spacing of the truss structure
ω: strut inclination angle (i.e., the angle between the facesheet and the strut)
r: radius of the fillet at the intersection between struts (typically $$\frac{D}{4})$$

(i.e., the radius of a curve formed by a cutting plane parallel to the struts)
k: Euler buckling end-condition parameter (varies between 1 (pinned) and 2 (clamped) for truss cores) (i.e., this quantity may be between 1.0 and 2.0 and is equal to 1.5 in one embodiment)
E: Young's modulus
$E_T$: tangent modulus
$\sigma_{yield}$: yield strength
ν: Poisson's ratio $$z = \frac{1}{2}\left(\frac{L\tan(\omega)}{\sqrt{3}} - H\right):$$

height truncation of a 3 fold truss $$z = \frac{1}{2}\left(\frac{L\tan(\omega)}{2} - H\right):$$

height truncation of a 4 fold truss

In one embodiment, the strut outer diameter D and the strut wall thickness t are selected so that:

$$\frac{\sigma_{global}}{\sigma_{local}} = \frac{(Al^2 + 48I(1+v))\sin(\omega)}{96I^2\sin(\omega)(1+v) + 2AIl(3D\cos(\omega) + l\sin(\omega))}$$

$$z \leq \frac{D}{2\cos(\omega)} + r\left(\frac{1}{\cos(\omega)} - 1\right) - t$$

Where:

$$\sigma_{global} = \min\begin{cases} \frac{\pi^2 k^2 E_T I}{l^2 A} \\ \sigma_{yield} \end{cases}$$

$$\sigma_{local} = \frac{\eta_l 2E\gamma}{\sqrt{3(1-v^2)}} \frac{t}{D}$$

$$\gamma = 1 - .901(1 - e^{-\phi})$$

$$\phi = \frac{1}{16}\sqrt{\frac{D}{2t}}$$

Where:
$\eta_l \approx 0.02777\ z + 0.08629$
arises from a combination of material behavior and stress concentrations at the intersection between struts.

In some embodiments, H is less than 2.00 meters and H is greater than 2 millimeters (0.002 m); in some embodiments the sandwich core thickness falls in the range of 2.0 mm to 200.0 mm, and in some embodiments it falls in the range of 6.0 mm to 50.0 mm. In some embodiments, values for L with respect to H are defined by the relations:

$$L \geq \frac{H}{2\tan(\omega)} \text{(for 4 fold trusses)}$$

$$L \geq \frac{H}{\sqrt{3}\tan(\omega)} \text{(for 3 fold trusses)}.$$

Example 1: Electrodeposited Co—Re Truss

Figure 11:
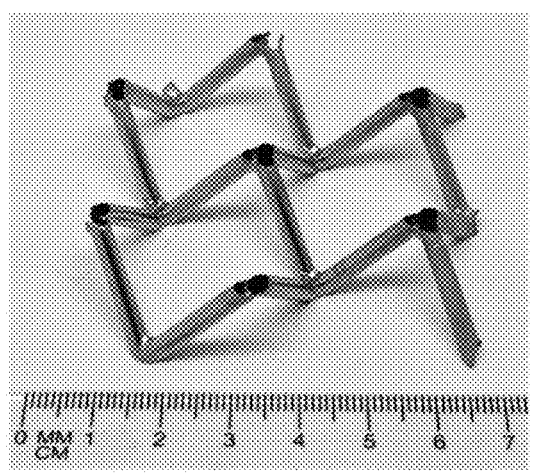
FIG. 11 is a perspective view of a truss core according to an embodiment of the present invention.

A polymer micro-truss manufactured as described above was metallized by evaporation of titanium to a thickness of 0.5 micrometer and platinum to a thickness of 0.1 micrometer. The metalized micro-truss was then electroplated with cobalt in an aqueous solution of 360 g/l $CoSO_4$, 45 g/l boric acid and 17 g/l NaCl. at 10 mA/cm$^2$ for 75 minutes to a thickness of approximately (about) 15 microns. The cobalt micro-truss was then plated in a cobalt rhenium plating solution. Improvements to the plating technology were made to improve the plating quality of the micro-truss. Dual platinum coated titanium mesh anodes were used to improve the current distribution on the micro-truss. The sample was racked with multiple wires to improve current distribution on the thin metal conductive layer, as will be understood by one of skill in the art. Plating was performed using a high level of agitation at the cathode to enable high mass transfer at the plating surface and to remove bubbles from the surface due to gas evolution, which may leave gas marks in cobalt and cobalt alloy deposition. The pH of the solution was maintained throughout the deposition with periodic additions of ammonium hydroxide. Deposition was performed at 65° C. and 50 mA/cm$^2$ for 1 hour resulting in a deposition thickness of 30 microns. The resulting alloy was analyzed by energy-dispersive X-ray spectroscopy (EDX) to confirm the Co—Re composition. The resulting micro-truss is shown in FIG. 11. Optional subsequent processing includes removing the polymer and/or adding additional metals or alloys to the existing metal.

Figure 12:
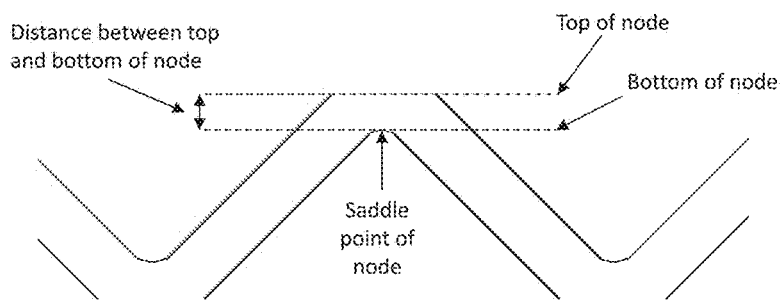
FIG. 12 is a schematic cross-sectional view of a truss core according to an embodiment of the present invention.

The strength of the core can be increased by truncating the nodes. (Details in paper). In one embodiment includes a core where the bottom of the hollow node is spaced from the top of the node at a distance of less than 15% of the core height as shown in FIG. 12. The bottom of the hollow node may coincide with a saddle point in the exterior surface of the hollow node. In one embodiment, the closer the bottom of the node is spaced to the top of the node, the greater the strength.

Figure 13:
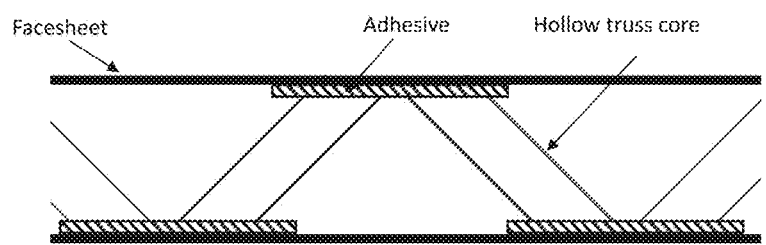
FIG. 13 is a schematic cross-sectional view of a sandwich according to an embodiment of the present invention.

In one preferred embodiment when attaching facesheets, measures are taken to ensure that the adhesive also bonds the bottom of the node directly to the facesheet as shown in FIG. 13. This ensures load transfer to a larger area of the node and decreases stress concentrations. Furthermore, this mitigates failure at the core—facesheet interface on loading. Also, the adhesive fixes the bottom of the node, so that no buckling or deformation can initiate there.

Figure 14A:
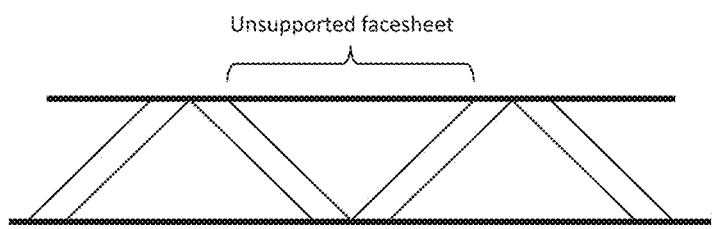
FIG. 14A is a schematic cross-sectional view of a truss core according to an embodiment of the present invention.
Figure 14B:
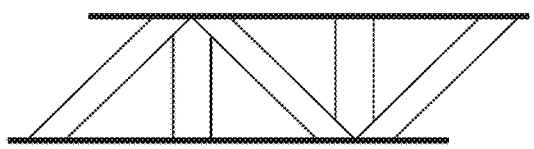
FIG. 14B is a schematic cross-sectional view of a truss core according to an embodiment of the present invention.
Figure 15:
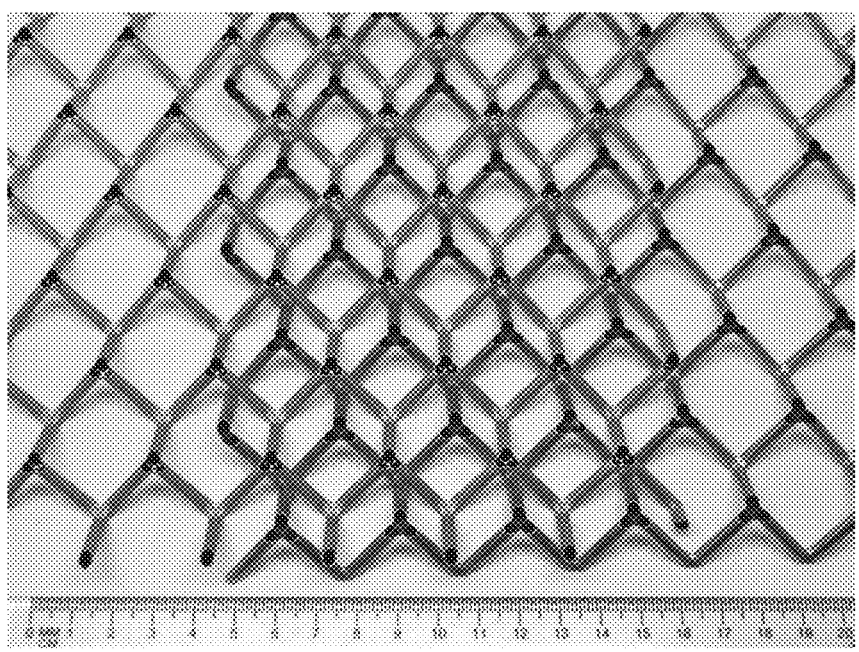
FIG. 15 is a top view photograph of two partially overlapping truss cores according to an embodiment of the present invention.

Tetrahedral (3-fold) cores can be interlaced to form a larger core. Thereby two cores are arranged to overlap as seen in FIGS. 14B and 15. This allows splicing smaller cores to form a larger core, and may reduce the amount of unsupported facesheet, as illustrated in FIGS. 14A and 14B. FIG. 15 shows an upper core segment partially overlapping a lower core segment. A plurality of such lower core segments (e.g., square lower core segments) may be tiled together to cover a larger area, and a plurality of upper core segments (e.g., having the same size as the lower core segments) may then be tiled over the lower core segments (e.g., the upper core segments being offset from the lower core segments). A multitude of core segments with a square shape can thus be arranged into one large, continuous, uniform core by interlacing, e.g., every quarter of each core with a quarter of the adjacent core. In one embodiment, continuous facesheets are attached to such a spliced core.

Figure 16A:
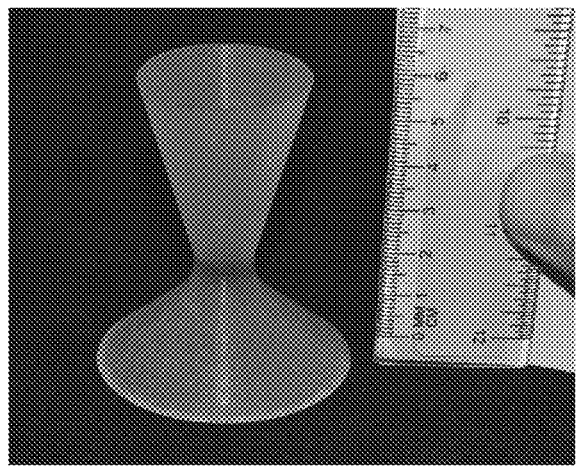
FIG. 16A is a perspective view photograph of a polymer template for a thruster according to an embodiment of the present invention.
Figure 16B:
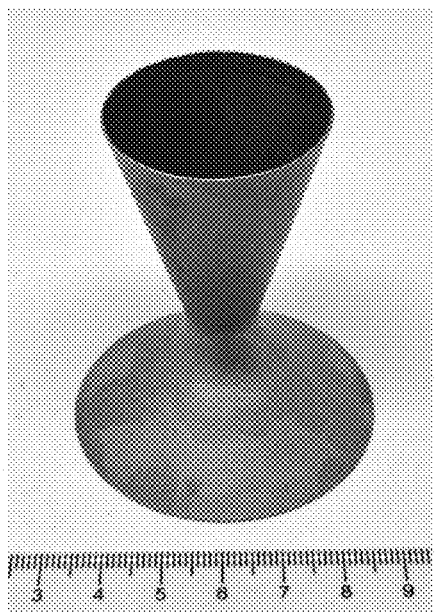
FIG. 16B is a perspective view photograph of a thruster according to an embodiment of the present invention.

The method disclosed here can also be used to fabricate other thin-walled structures out of a high temperature alloy. In one embodiment, the wall thickness is less than 300 microns to enable interdiffusion of the layers in a reasonable time frame such as less than 100 hours. Thin-walled, high temperature structures of interest that are not truss cores are for example thrusters for satellite propulsion. FIG. 16 shows thrusters for a propulsion system of a small satellite that were fabricated by first 3D printing a polymer template via stereolithography, then rendering the template conductive by spray coating it with a conductive silver paint. Then the part was electroplated with 100 microns of nickel. Then the polymer template was etched out with 2 molar sodium hydroxide solution. Then a diffusion chromium coating was deposited on the hollow nickel part by pack cementation resulting in approximately 32 microns of effective chromium thickness. Then a diffusion aluminum coating was deposited on the hollow part by pack cementation resulting in approximately 31 microns of effective aluminum thickness. Then the part was heat treated at 1100 C for 50 hours in argon to interdiffuse Ni, Cr and Al, and simple Inconel-type alloy was formed. The alloy was then aged at 900 C for 12 hours to establish a gamma-gamma prime microstructure that, in some embodiments, is a characteristic of superalloys and provides good high temperature mechanical properties.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration.

As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, two, three, or more layers are said to be "coupled with" each other, if they are in direct or indirect contact. For example, if a third layer is directly on a second layer, which is directly on a first layer, the first, second, and third layers may be said to be coupled with each other.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

As used herein, an elemental thickness of a layer is defined to be the thickness of the layer of the element as deposited. Aluminum and chromium typically react with nickel or cobalt when they are deposited at elevated temperatures by pack cementation or CVD and form an intermetallic. Therefore the thickness of a layer is the thickness that was added by the deposition, even though after the deposition there is a NiAl layer for example.

Although limited embodiments of a curved high temperature alloy sandwich panel with a truss core and fabrication method have been specifically described and illustrated herein, many modifications and variations will be apparent to those skilled in the art. Accordingly, it is to be understood that curved high temperature alloy sandwich panel with a truss core and fabrication method employed according to principles of this invention may be embodied other than as specifically described herein. The invention is also defined in the following claims, and equivalents thereof.

What is claimed is:

1. An article, comprising:
a core; and
two facesheets secured to the core;
the core comprising:
a plurality of hollow first truss members extending in a first direction; and
a plurality of hollow second truss members extending in a second direction;
the truss members of the plurality of first truss members and the plurality of second truss members interpenetrating at a plurality of hollow nodes,
each of the hollow nodes being immediately adjacent to, and secured to, one of the two facesheets,
each of the truss members of the plurality of first truss members and the plurality of second truss members having:
an outside diameter between 0.1 mm and 5 mm,
a length between 3 mm and 50 mm, and
a wall thickness between 1 micron and 1000 microns,
wherein a hollow node is truncated, so that a saddle point of the hollow node is spaced from the facesheet to which it is immediately adjacent by a distance of less than one half of an outside diameter of a hollow truss member extending from the hollow node.

2. The article of claim 1, wherein the two facesheets are attached to the core with an adhesive configured to transfer a load directly from a portion of a hollow node including a saddle point of the hollow node to the facesheet to which the hollow node is immediately adjacent.

3. The article of claim 1, further comprising a hollow fourth truss member perpendicular to the two facesheets and interpenetrating one of the truss members of the plurality of first truss members and the plurality of second truss members at one of the plurality of hollow nodes.

4. The article of claim 1, wherein the core comprises two interlaced tetrahedral structures.

5. The article of claim 1, wherein a truss member of the truss members of the plurality of first truss members and the plurality of second truss members comprises:
a first coating layer comprising, as a major component, a substance selected from the group consisting of nickel, cobalt, iron, and combinations thereof;
a second coating layer comprising chromium or NiCr, the second coating layer having a Cr thickness of 10-40% of the thickness of the first coating layer,
a third coating layer of aluminum or NiAl, the third coating layer having a Al thickness of 10-40% of the thickness of the first coating layer.

6. The article of claim 5, wherein the truss member further comprises a fourth coating layer having a thickness between 1% and 15% of a thickness of the first coating layer, the fourth coating layer comprising, as a major component, a substance selected from the group consisting of Mo, W, Ta, Ti, and Re, and combinations thereof.

7. The article of claim 6, wherein the truss member further comprises a fifth coating layer having a thickness less than 2% of the thickness of the first coating layer, the fifth coating layer comprising, as a major component, a substance selected from the group consisting of Si, C, B, Zr, Hf, and Y, and combinations thereof.

8. The article of claim 1, wherein a facesheet of the two facesheets has a radius of curvature between 5 cm and 10 m.

9. The article of claim 1, wherein a facesheet of the two facesheets has a radius of curvature greater than 10 m.

10. The article of claim 1, wherein a facesheet of the two facesheets has a first radius of curvature at a first point on the facesheet and a second radius of curvature at a second point on the facesheet, and the second radius of curvature differs by at least 30% from the first radius of curvature.

11. The article of claim 1, wherein a first facesheet of the two facesheets has a first normal at a first point, and a second facesheet of the two facesheets has a second normal at a second point opposite the first point, wherein the angle between the first normal and the second normal is less than 175 degrees.

12. The article of claim 1, wherein a feature selected from the group consisting of fasteners, bushings, inserts, and combinations thereof, is embedded in the core and in a facesheet of the two facesheets.

13. The article of claim 1, wherein a density of the core in a first region within the article is greater by 10% than a density of the core in a second region within the article.

14. The article of claim 1, wherein a truss member of the truss members of the plurality of first truss members and the plurality of second truss members has a cross-sectional shape selected from the group consisting of ovals, rectangles, and irregular shapes.

15. The article of claim 1, further comprising:
three standoffs secured to a first facesheet of the two facesheets, each of the three standoffs having a length between 1 cm and 10 cm, and
a thermally insulating material adjacent to the first facesheet.

16. The article of claim 15, further comprising a radiation barrier within the core.

17. The article of claim 15, further comprising a thermally insulating material within the core.

18. The article of claim 1, wherein:
the two facesheets comprise a first curved facesheet and a second curved facesheet;
the article has a shape of an airfoil, a flight control surface, or a leading edge;
each of the truss members of the plurality of first truss members and the plurality of second truss members has a wall thickness between 30 microns and 500 microns;
the wall thickness is between 0.01 and 0.1 times the outside diameter.

19. The article of claim 18, wherein each of the hollow nodes is immediately adjacent to, and secured to, a facesheet of the two facesheets.

20. The article of claim 18, further comprising an internal sheet in the core, wherein each of the hollow nodes is immediately adjacent to, and secured to:
a facesheet of the two facesheets, or
the internal sheet.

21. The article of claim 1, wherein the core further comprises a plurality of hollow third truss members extending in a third direction,
the truss members of the plurality of first truss members, the plurality of second truss members, and the plurality of third truss members interpenetrating at the plurality of hollow nodes.

22. The article of claim 1, wherein the truss members of the plurality of first truss members and the plurality of second truss members comprise, as a major component, an element selected from the group consisting of Ni, Co, Fe, Cu, Cr, Zn, Sn, and combinations thereof.

* * * * *